US007940090B2

(12) United States Patent
Yoshida

(10) Patent No.: US 7,940,090 B2

(45) Date of Patent: May 10, 2011

(54) ZERO-CROSSING DETECTING DEVICE AND IMAGE FORMING DEVICE

(75) Inventor: Tatsuho Yoshida, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 12/503,956

(22) Filed: Jul. 16, 2009

(65) Prior Publication Data

US 2010/0045346 A1 Feb. 25, 2010

(30) Foreign Application Priority Data

Aug. 22, 2008 (JP) ................................ 2008-214220

(51) Int. Cl.
*H03K 5/153* (2006.01)

(52) U.S. Cl. ........................................... 327/79; 327/84

(58) Field of Classification Search ..................... 327/79
See application file for complete search history.

(56) References Cited

U.S. PATENT DOCUMENTS

| | | | | |
|---|---|---|---|---|
| 6,664,817 | B2 * | 12/2003 | Nakata et al. | 327/79 |
| 7,186,956 | B2 * | 3/2007 | Chae | 219/497 |
| 7,679,354 | B2 * | 3/2010 | Shin | 323/325 |
| 7,723,925 | B2 * | 5/2010 | Mosebrook et al. | 315/246 |
| 7,729,207 | B2 * | 6/2010 | Kawaguchi | 368/204 |

FOREIGN PATENT DOCUMENTS

JP 2006-258698 A 9/2006

* cited by examiner

*Primary Examiner* — Lincoln Donovan
*Assistant Examiner* — Sibin Chen
(74) *Attorney, Agent, or Firm* — Posz Law Group, PLC

(57) ABSTRACT

A zero-crossing detecting device that detects a zero-crossing point of AC voltage, the device has a full-wave rectifier that rectifies the AC voltage and outputs a full-wave rectified voltage, a charger that is charged at a predetermined charging voltage by application of the full-wave rectified voltage, wherein the charger outputs a charging current when the full-wave rectified voltage falls below the charging voltage, and a signal output part that outputs a zero-crossing detecting signal. The signal output part outputs the zero-crossing detecting signal when the charging current flows to the signal output part.

14 Claims, 10 Drawing Sheets

100a
1
2
4
6
D1
D2
A
D5
ZD1
R2
B
I7
5V
E
C1
7
R3
P
R1
D6
ZD2
D3
D4
3
5a 200
204
203
S
202
201

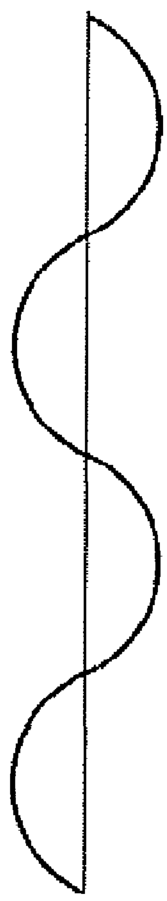
Fig.6A
I1
Fig.6B
I2
Fig.6C
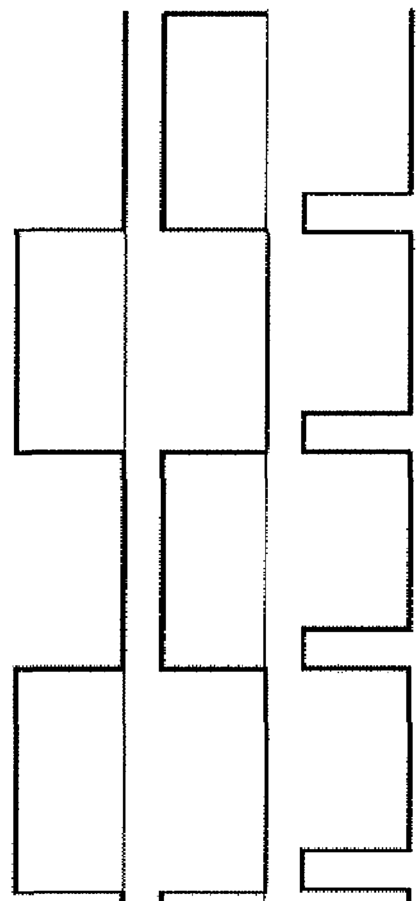
Fig.6D
Fig.6E
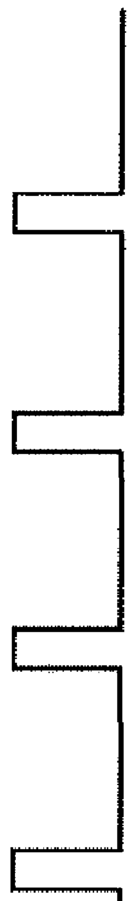
Fig.6F

E
G

A
B
V1
V2
ΔV

I7

P

ZERO-CROSSING DETECTING DEVICE AND IMAGE FORMING DEVICE

CROSS REFERENCE TO RELATED APPLICATION

The invention is related to, claims priority from, and incorporates by reference Japanese Patent Application No. 2008-214220, filed on Aug. 22, 2008.

TECHNICAL FIELD

The invention relates to a zero-crossing detecting device that detects a point of zero charge (zero-crossing point) of alternating-current (AC) voltage, and an image forming device that has the zero-crossing detecting device.

TECHNICAL BACKGROUND

An image forming device such as an electrographic printer is driven with AC power supply (AC voltage), and a power supply control for a heater to heat a fusing roller is made by using a switching element such as a triode ac (TRIAC).

A change in resistance of the heater for heating the fusing roller as a function of temperature is wide, and an inrush current corresponding to a current that is several times that of a rated current may instantly flow into the heater when the heater is cold and the internal resistance is small. When the inrush current that is overcurrent flows into the heater, the heater may be overloaded and damaged.

Therefore, it is proposed that the image forming device have a zero-crossing detecting circuit that detects the zero-crossing point of AC voltage and outputs a zero-crossing signal each time the zero-crossing point is detected in order to control the switching element to turn ON when the AC voltage passes the point of zero charge (zero-crossing point) to reduce the inrush current to the heater. As the zero-crossing detecting circuit, for example as disclosed in Japanese laid-open application 2006-258698, it is proposed that the zero-crossing detecting circuit includes a first photocoupler, which detects a positive half-wave of AC voltage and outputs a square-wave corresponding to the half-wave, and a second photocoupler, which detects a negative half-wave of AC voltage and outputs a square-wave corresponding to the half- The proposed circuit outputs the zero-crossing signal by detecting the zero-crossing point based on the square-waves output from each photocoupler.

FIG. 5 illustrates a related zero-crossing detecting circuit 300, and FIGS. 6A-6F illustrate signal waveforms that respective parts of the related zero-crossing detecting circuit 300 output. In the related zero-crossing detecting circuit 300, when a current I1, which is represented by the waveform shown in FIG. 6B, flows into a photodiode (light-emitting element) in a photocoupler 301 based on the positive half-wave of an AC voltage E shown in FIG. 6A, the photodiode emits light. The emitted light is received by a phototransistor (light-receiving element) in the photocoupler 301.

Since the phototransistor in the photocoupler 301 turns ON when it receives the light from the photodiode mentioned above, it outputs an output signal F1, which is a square-wave shown in FIG. 6D, to a signal converter 303.

Similarly, in the related zero-crossing detecting circuit 300, when a current I2, which is represented by the waveform shown in FIG. 6C, flows into a photodiode in a photocoupler 302 based on a negative half-wave of the AC voltage E shown in FIG. 6A, the photodiode emits light. The emitted light is received by a phototransistor in the photocoupler 302.

The phototransistor in the photocoupler 302 turns ON by receiving the light mentioned above, therefore an output signal F2, which is a square-wave as shown in FIG. 6E, is output to the signal converter 303.

When the output signal F1, which is represented by the square-wave shown in FIG. 6D, and the output signal F2, which is represented by the square-wave shown in FIG. 6E, are input, the signal converter 303 converts the output signals Fl and F2 respectively based on OR (logical sum), and outputs a zero-crossing signal P0 that is a pulse signal showing a rising timing of each signal. The waveform diagram of the zero-crossing signal P0 is illustrated in FIG. 6F.

However, since the related zero-crossing detecting circuit 300 mentioned above is configured to send current constantly to the photocouplers 301 and 302 so as to output the zero-crossing signal P0, there is a problem that the zero-crossing detecting device or the image forming device in which it is installed consumes a relatively large amount of power.

In view of this problem, the invention provides a zero-crossing detecting device and an image forming device including the zero-crossing detecting device that are driven with low power consumption and are able to detect a zero-crossing point of AC voltage.

SUMMARY

For solving the problem above, the invention employs the following configurations. A first configuration is a zero-crossing detecting device that detects a zero-crossing point of AC voltage, a zero-crossing detecting device in the present invention is characterized to include a full-wave rectifier that outputs a full-wave rectified voltage by rectifying AC voltage, a charger that is charged at a predetermined charging voltage by applying the full-wave rectified voltage and outputs a charging current when the full-wave rectified voltage becomes below the charging voltage, and a signal output part that outputs a zero-crossing detecting signal by input of the charging current.

A second configuration is an image forming device that includes the zero-crossing detecting device of the first configuration.

With the zero-crossing point detecting device of these configurations, when a full-wave rectifier outputs a full-wave rectified voltage after rectifying AC voltage, a charger is charged at a predetermined charging voltage by applying the full-wave rectified voltage until the AC voltage is in the neighborhood of a zero-crossing point. The zero-crossing point detecting device outputs a charging current when the AC voltage is in to the neighborhood of the zero-crossing point and is below the charging voltage; therefore, the charger can output a zero-crossing signal by sending the charging current to a signal output part only for a short time in the neighborhood of the time of the zero-crossing point.

BRIEF DESCRIPTION OF DRAWINGS

FIGS. 6A-6F illustrate signal waveforms that are output from parts of the related zero-crossing detecting circuit of FIG. 5.

DETAILED DESCRIPTION

Preferred embodiments of the invention are described in detail with reference to the drawings.

Embodiment 1

Figure 2:
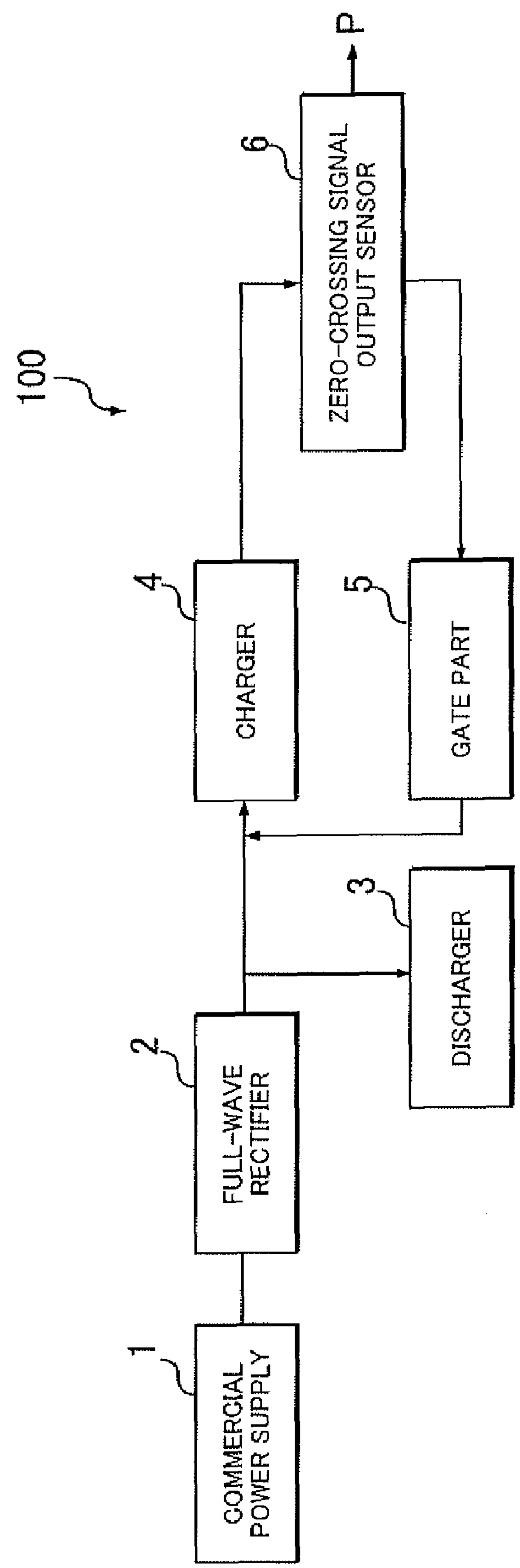
FIG. 2 illustrates a configuration of the zero-crossing detecting device of the embodiment of FIG. 1.

FIG. 2 is a block diagram showing a configuration of a zero-crossing detecting device 100 of the first embodiment. The zero-crossing detecting device 100 consists of a commercial power supply 1, a full-wave rectifier 2, a discharger 3, a charger 4, a gate part 5 (or gate means), and a zero-crossing signal output sensor 6 (or zero-crossing signal output part), as shown in FIG. 2.

Figure 1:
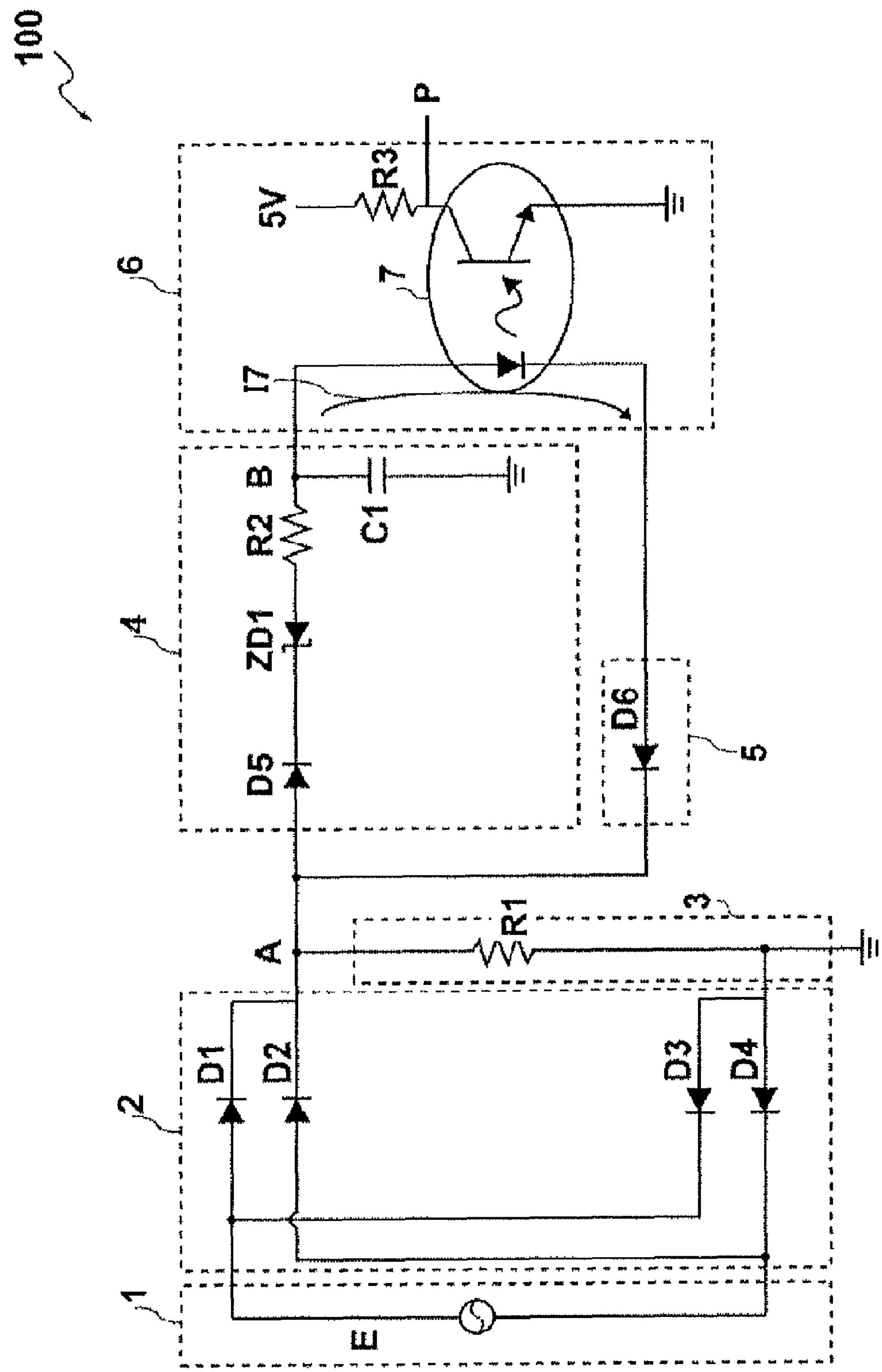
FIG. 1 illustrates a circuit configuration of a zero-crossing detecting device of a first embodiment related to the invention.

FIG. 1 is a circuit diagram showing the configuration of the zero-crossing detecting device 100, and FIGS. 3A-3D illustrate signal waveforms that are output from parts of the zero-crossing detecting device 100. The commercial power supply 1 is an AC power supply provided from an electric power company for industrial use and for home use. The AC power supply provides an AC voltage E, which is represented by the waveform shown in FIG. 3A, to the full-wave rectifier 2.

Figures 3A, 3B, 3C, 3D:
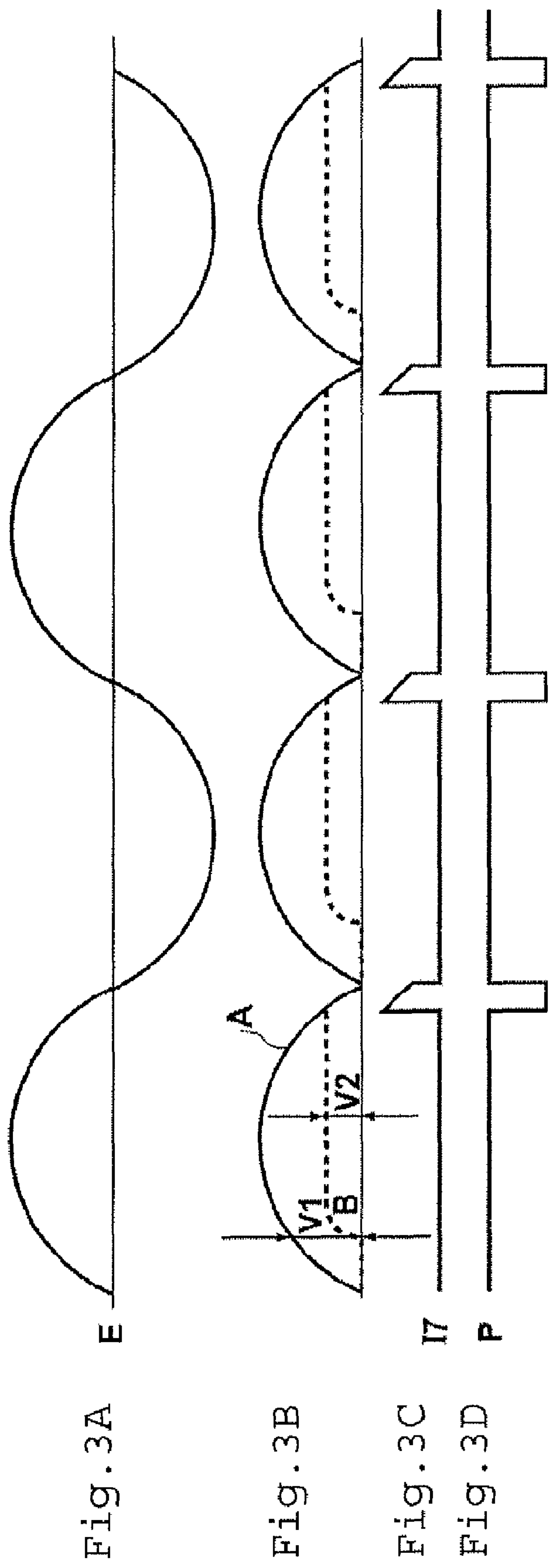
FIGS. 3A-3D illustrate signal waveforms that are output from each part of the zero-crossing detecting device of the embodiment of FIG. 1.

The full-wave rectifier 2 has a bridge circuit that consists of diodes D1, D2, D3, and D4, rectifies the full-wave of the AC voltage E using the bridge circuit, and outputs a full-wave rectified voltage A, which is represented by the solid waveform shown in FIG. 3B.

The discharger 3 has a resistance R1 as shown in FIG. 1.

On the other hand, when a current I7 mentioned below is provided from a gate part 5 as shown in FIG. 1, the discharger 3 discharges the current I7 to a ground by using the resistance R1.

The charger 4 consists of a diode D5, a zener diode ZD1, a resistance R2 for preventing an inrush current, and a capacitor C1 for storing electric charge to provide it to the zero-crossing output sensor 6, as shown in FIG. 1. In the charger 4, a current based on the full-wave rectified voltage A mentioned above flows to the diode D5 when the full-wave rectified voltage A is over a voltage V1 shown in FIG. 3B, The voltage V1 is determined by a constant number of the zener diode ZD1, the resistance R2, and the capacitor C1. The current that passes through the diode D5 flows through the zener diode ZD1, the resistance R2, and the capacitor C1 in that order, and is charged as electric charge in the capacitor C1.

When the capacitor C1 starts storing the electric charge, a charging voltage B is represented by the dotted line waveform shown in FIG. 3B. The capacitor C1 continues storing charge until the charging voltage B becomes a saturation voltage V2 shown in FIG. 3B.

After that, as shown in FIG. 3B, the capacitor C1 discharges the stored electric charge when the full-wave rectified voltage A falls according to a power supply period of the AC voltage E, and falls below the charging voltage B of the capacitor C1. That is, the capacitor C1 discharges when the voltage E is in the neighborhood of the zero-crossing point. The discharged electric charge is provided to the zero-crossing signal output sensor 6 by the gate part 5.

The gate part 5, which consists of a diode D6, is used to transmit the discharged electric charge by the capacitor C1 of the charger 4 to a photodiode of a photocoupler 7 in the zero-crossing signal output sensor 6. The photocoupler 7 includes a photodiode, a phototransistor, and an uninterrupted light path between the photodiode and the phototransistor, as shown in FIG. 1. The current I7 that flows into the gate part 5 is output to the discharger 3 after passing through the photodiode of the photocoupler 7.

The zero-crossing signal output sensor 6 consists of the photocoupler 7 and a pull-up resistance R3 for preventing voltage fluctuation of a direct-current (DC) power supply 5V. That is, in the zero-crossing signal output sensor 6, the electric charge is provided from the charger 4 by the gate part 5, and the photodiode emits light when the current I7, which has the waveform shown in FIG. 3C, flows to the photodiode of the photocoupler 7. The emitted light is received by the phototransistor of the photocoupler 7.

Since the phototransistor in the photocoupler 7 turns ON only for a short time by receiving the light mentioned above, it outputs a current from the 5V DC power supply to form a square-wave, or pulse, zero-crossing detecting signal P, which is synchronized with the timing of the AC voltage E passing through the zero-crossing point as shown in FIG. 3D.

According to the zero-crossing detecting device 100 of the embodiment of FIG. 1, since the current I7 does not flow to the photocoupler 7 until the full-wave rectified voltage A is in the neighborhood of the zero-crossing point, and the phototransistor does not emit light most of the time, the zero-crossing detecting signal P is provided by using a relatively small amount of power.

The zero-crossing detecting device 100 of FIG. 1 is installed in a device such as an image forming device that controls a provided power based on the zero-crossing detecting signal P by a phase control. For example, an image forming device that has the zero-crossing detecting device 100 performs heating control of a heater placed inside a heating roller of a fuser based on the zero-crossing detecting signal P output from the device, as described below. The image forming device can be a color printer, a black and white printer, a copier, a fax machine, and Multi Function Peripheral (MFP), for example.

Figure 4:
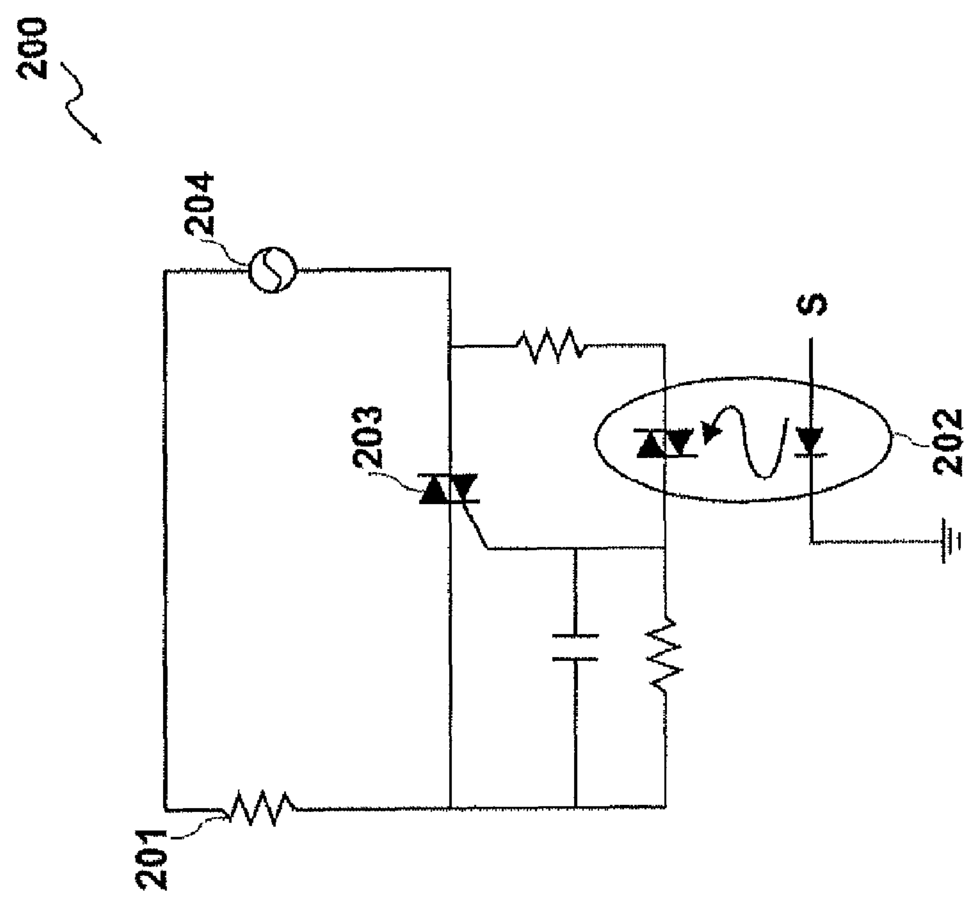
FIG. 4 illustrates a heater control circuit of a fuser in an image forming device, which is an example of an application of the circuit of FIG. 1.
Figure 5:
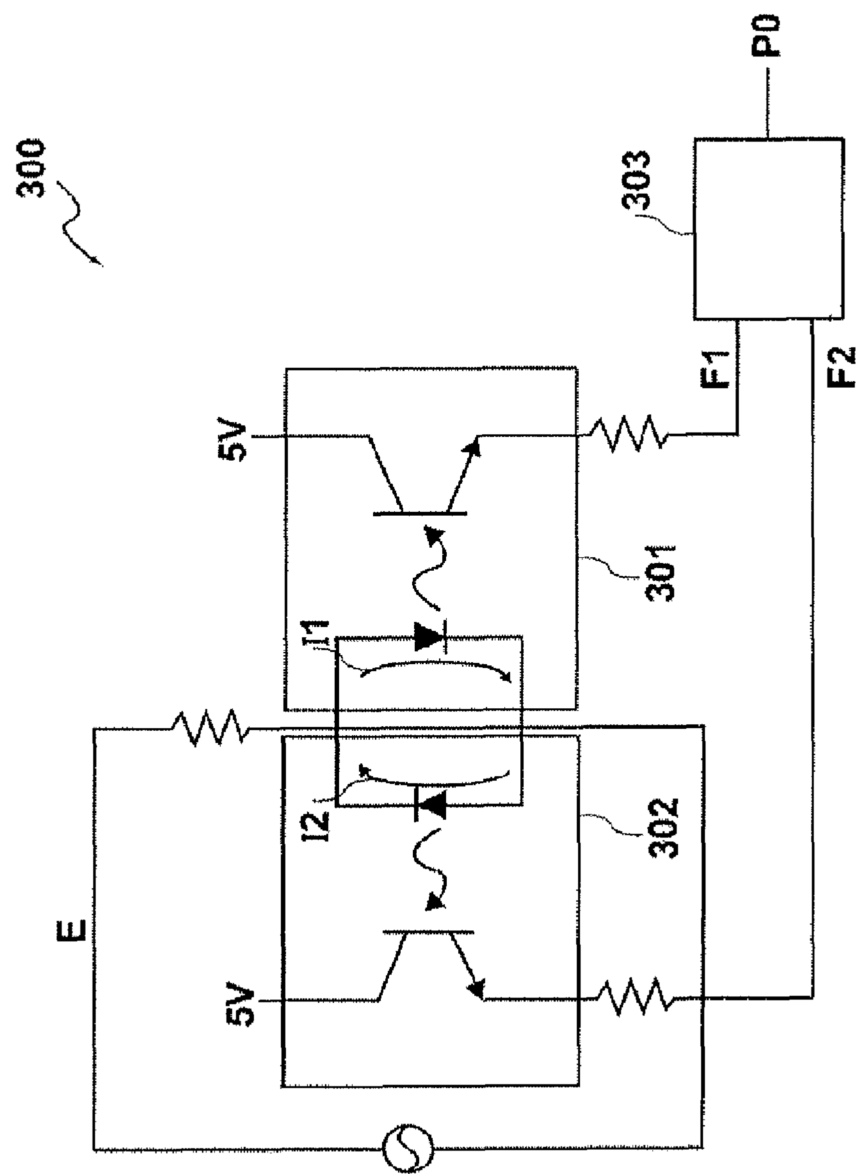
FIG. 5 illustrates a related zero-crossing detecting circuit.

FIG. 4 illustrates a configuration of a heater control circuit 200 of a fuser in an image forming device having the zero-crossing detecting device 100 of the embodiment 1 related to the invention. The image forming device controls the timing to operate the heater mentioned above by using the heater control circuit 200 shown in FIG. 4.

The heater control circuit 200 consists of a heater 201 in the heating roller of the fuser (not shown), a photo-TRIAC 202, a TRIAC 203, and an AC power supply 204, as shown in FIG. 4.

The heater control circuit 200 is controlled by a CPU of the image forming device. The CPU outputs a pulse signal S to the photo-TRIAC 202 of the heater control circuit 200 in order to heat the heater in synchronism with the rising of the zero-crossing detecting signal P shown in FIG. 3D, which is output from the zero-crossing detecting device 100. Here, the CPU controls an output time of the pulse signal S etc. based on a surface temperature that is detected by a temperature sensor to detect the surface temperature of the heating roller of the fuser.

The photodiode of the photo-TRIAC 202 emits light when the pulse signal S is input. The emitted light is received by a TRIAC in the photo-TRIAC 202.

The TRIAC in the photo-TRIAC 202 turns ON when it receives the light from the photodiode, which causes a TRIAC 203 to conduct.

When the TRIAC 203 conducts, a current based on an AC voltage that is output from an AC power supply 204 flows into a heater 201, and the heater generates heat and heats the heating roller of the fuser from inside.

An image forming device having the zero-crossing detecting device and the heater control circuit 200 of FIG. 4, the zero-crossing detecting device 100 can be driven with a low power consumption. Therefore, the device can be driven with relatively low power consumption.

Embodiment 2

Figure 8:
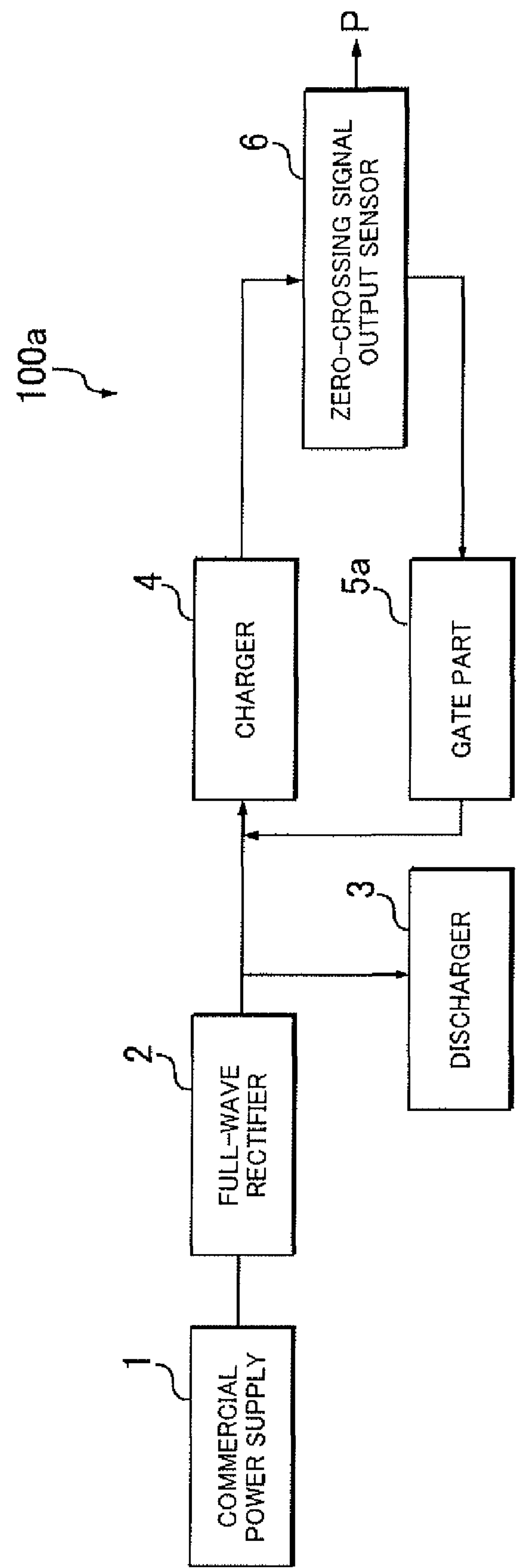
FIG. 8 illustrates a configuration of a zero-crossing detecting device of a second embodiment of the invention.
Figure 9:
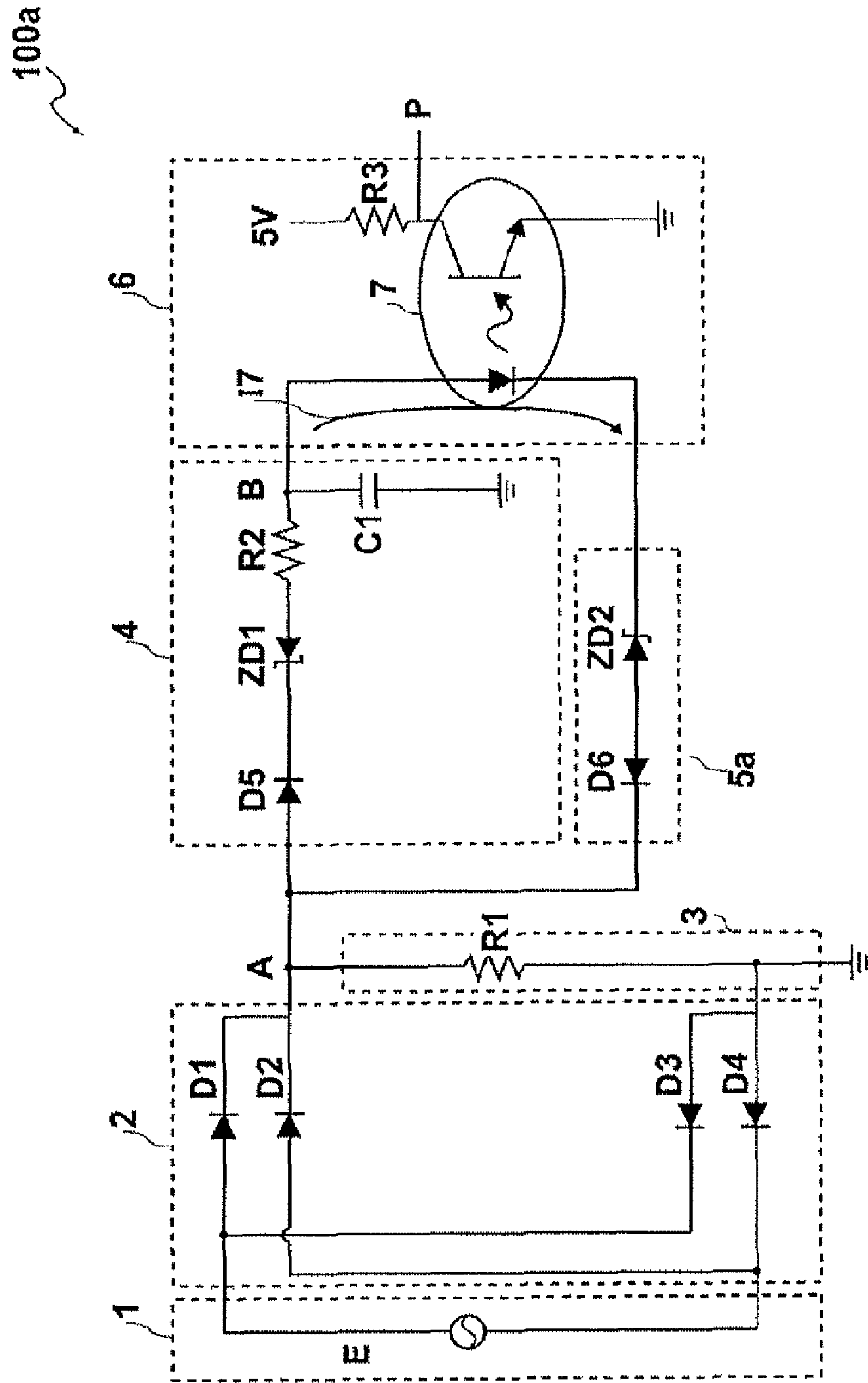
FIG. 9 illustrates a circuit configuration of the zero-crossing detecting device of the second embodiment of FIG. 8.

Compared with the configuration of the zero-crossing detecting device 100 of FIG. 1, a zero-crossing detecting device 100*a* of FIGS. 8 and 9 is configured to add a zener diode ZD2 to a gate part 5*a* for preventing the detection of noise and accidental output of noise detection as the zero-crossing detecting signal when the noise is mixed in an AC voltage E output from a commercial power supply 1.

Figures 7A, 7B, 7C, 7D:
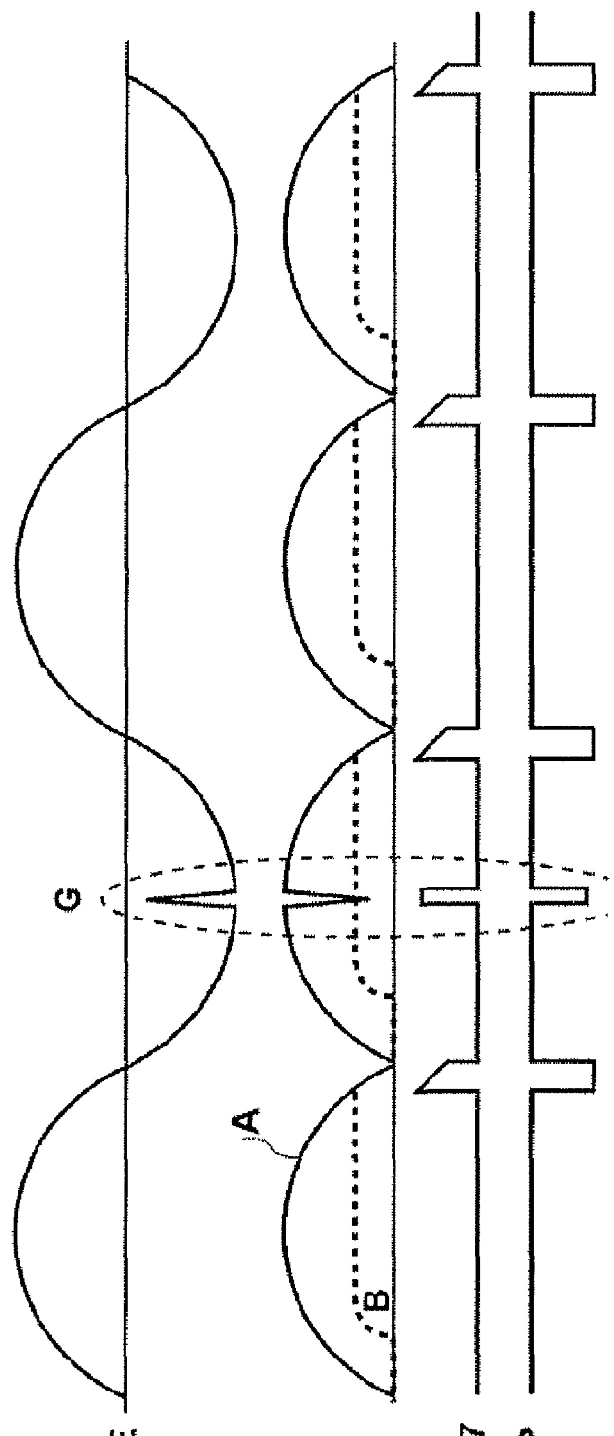
FIGS. 7A-7D illustrate signal waveforms that are output when a superimposed noise is mixed into a commercial power supply of the zero-crossing detecting device of the embodiment of FIG. 1.

FIGS. 7A-7D illustrate signal waveforms output from each part of the zero-crossing detecting device 100 in the first embodiment of FIG. 1 when noise is mixed in the output of the commercial power supply 1. As shown in FIG. 7A, when noise G occurs in the AC voltage E output from the commercial power supply 1, the full-wave rectifier 2 outputs a full-wave rectified voltage A with the noise shown in FIG. 7B based on the AC voltage E.

When a current based on the full-wave rectified voltage A via the discharger 3 is input, the charger 4 charges the capacitor C1 via the diode D5, the zener diode ZD1, and the resistance R2.

When the full-wave rectified voltage A becomes smaller than the charging voltage B because of noise at the time of charging the capacitor C1 as shown in FIG. 7B, a photodiode emits light since a current (electric charge) is provided from the charger 4 and the charging current flows into the photodiode of the photocoupler 7.

Since the phototransistor in the photocoupler 7 turns ON by receiving the light signal from the associated photodiode, it outputs a noise signal caused by a noise part of the AC voltage E shown in FIG. 7D. The zero-crossing detecting device 100 of FIG. 1 may detect the noise part as a zero-crossing point when the noise is mixed into the AC voltage E as shown.

FIG. 8 is a block diagram that illustrates a configuration of the zero-crossing detecting device 100*a* of the second embodiment. The zero-crossing detecting device 100*a* in FIG. 8 consists of the commercial power supply 1, the full-wave rectifier 2, the discharger 3, the charger 4, a gate part 5*a*, and the zero-crossing signal output sensor 6 as shown, for preventing detection of the noise part of the AC voltage E as a zero-crossing point.

Figures 10A, 10B, 10C, 10D:
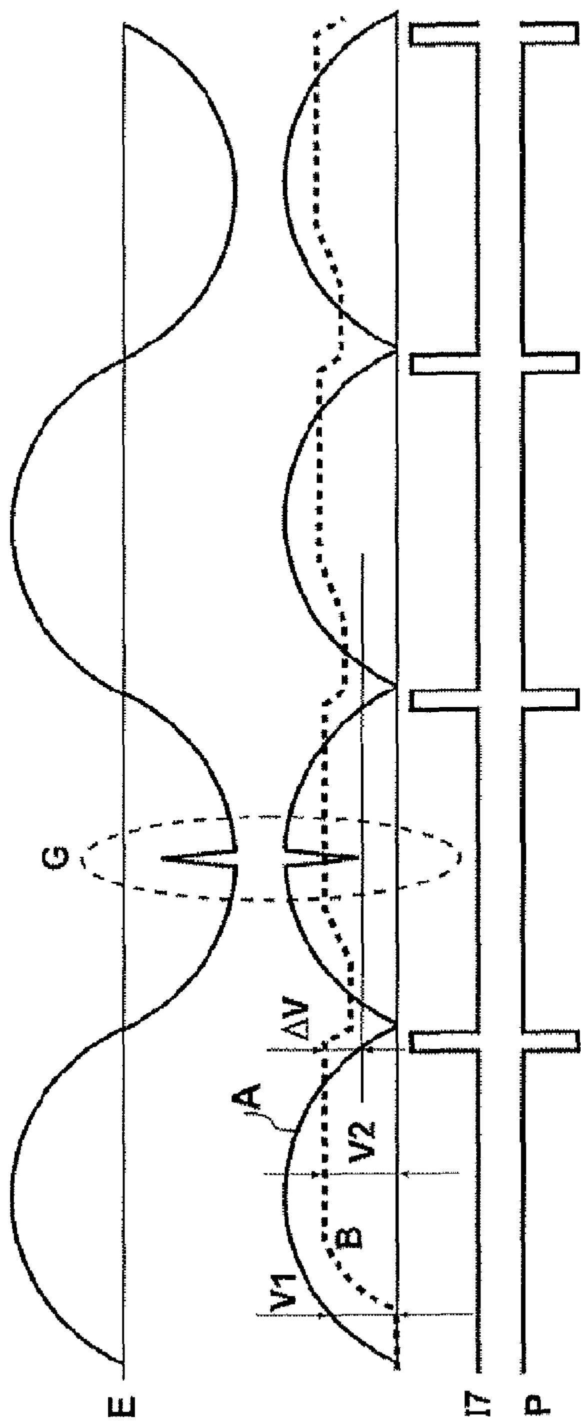
FIGS. 10A-10D illustrate signal waveforms that are output from parts of the zero-crossing detecting device of FIG. 8.

As shown in FIG. 9, the gate part 5*a* consists of a diode D6 and a zener diode ZD2 that has a zener voltage ΔV. As shown in FIG. 10B, when the full-wave rectified voltage A becomes lower than the charging voltage B of the capacitor C1 and the zener voltage ΔV of the zener diode ZD2, the capacitor C1 applies the charging voltage B (which is larger than the zener voltage ΔV) to the zener diode ZD2 in order to start discharging by the charging voltage B. By this, the zener diode ZD2 conducts and the current I7 is output to the photocoupler 7 as shown in FIG. 10C.

On the other hand, when a noise component is superimposed on the full-wave rectified voltage A, the zener diode ZD2 does not conduct and the electric charge is not provided to the photodiode of the photocoupler 7 from the capacitor C1, since the full-wave rectified voltage A is only added as a voltage below the zener voltage ΔV to the zener diode ZD2 because of the noise as shown at G in FIGS. 10B and 10C. Therefore, the noise part is not detected as a zero-crossing point. The zener voltage ΔV of the zener diode ZD2 is a slightly smaller value than the charging voltage B.

FIG. 9 illustrates a circuit configuration of the zero-crossing detecting device 100*a* of the second embodiment, and FIGS. 10A-10D illustrate signal waveforms output from each part of the zero-crossing detecting device 100*a* in the second embodiment. Like the zero-crossing detecting device 100 of the first embodiment, the AC voltage E shown in FIG. 10A is output from the commercial power supply 1, and the full-wave rectified voltage A shown in FIG. 10B is output by rectifying the full-wave of the AC voltage E in the full-wave rectifier 2. Then, a current based on the full-wave rectified voltage A is provided to the charger 4 via the discharger 3, and the capacitor C1 continues to store charge until the charging voltage B reaches a saturation voltage V2 as shown in FIG. 10B.

After that, as shown in FIG. 10B, when the full-wave rectified voltage A falls according to the power supply period of the AC voltage E, close to the zero-crossing point, and falls below the charging voltage B of the capacitor C1 and the zener voltage ΔV of the zener diode ZD2, that is, when the voltage A is in the neighborhood of the zero-crossing point, the capacitor C1 applies the charging voltage B to the zener diode ZD2 in order to start discharging by the charging voltage B. As a result, as shown in FIG. 10C, the zener diode ZD2 is caused to conduct, and the current I7 is output to the photocoupler 7.

In the zero-crossing signal output sensor 6, when the electric charge is provided from the charger 4 via the gate part 5*a* and the square-wave current I7 shown in FIG. 10C flows into the photodiode of the photocoupler 7, the photodiode emits light. The emitted light is received by the phototransistor of the photocoupler 7. The current I7 that flows into the gate part 5*a* after passing through the photodiode of the photocoupler 7 is output to the discharger 3.

Since the phototransistor of the photocoupler 7 turns ON only for a short time by receiving the light mentioned above, the zero-crossing signal output sensor 6 outputs a current from the DC 5V power supply to form a square-wave, zero-crossing detecting signal P, which is synchronized with the timing of the AC voltage E passing through the zero-crossing point as shown in FIG. 10D.

On the other hand, as shown in FIGS. 10A and 10B, when noise G is superimposed on the voltage E, since the full-wave rectified voltage A is smaller than the zener voltage ΔV, the zener diode ZD2 does not conduct; therefore, the current I7 does not flow and the noise signal does not affect the output of the signal P.

Otherwise, the configuration of the zero-crossing detecting device 100*a* of the second embodiment 2 is the same as that of the zero-crossing detecting device 100 of the first embodiment.

Also, the configuration of the heater heating control placed inside the heating roller of the fuser in the image forming device having the zero-crossing detecting device 100*a* of the second embodiment is the same as that of the heater heating control in the image forming device having the zero-crossing detecting device 100 of the first embodiment in the exemplary application described above.

According to the zero-crossing detecting device 100*a* of the second embodiment, when noise is mixed in the commercial power supply 1 and a noise component is superimposed onto the full-wave rectified voltage A, the zener diode ZD2 does not conduct since the full-wave rectified voltage A is only added to the zener diode ZD2 as a voltage below the zener voltage ΔV, the current I7 does not flow in the photodiode since the electric charge is not provided from the capacitor C1 to the photodiode of the photocoupler 7, and the zero-crossing detecting signal P based on the zero-crossing point can be output without detecting the noise component since the phototransistor does not emit light.

Although it is described to use the zener diode ZD2 as the gate part 5*a* in the second embodiment, there is no need to limit the gate part to a zener diode, and a DIAC, for example, may be employed instead.

What is claimed is:

1. A zero-crossing detecting device that detects a zero-crossing point of AC voltage, the device comprising:

a full-wave rectifier that rectifies the AC voltage and outputs a current based on a full-wave rectified voltage;

a charger, which includes a diode and a capacitor, wherein the capacitor is charged by the current and has a saturation voltage near the zero-crossing point, and the capacitor outputs a charging current when the full-wave rectified voltage falls below the saturation voltage, and wherein the diode prevents the charging current from flowing back into the full-wave rectifier;

a signal output part that outputs a zero-crossing detecting signal, wherein the signal output part outputs the zero-crossing detecting signal when the charging current flows to the signal output part; and a gate part, which that prevents the current output from the full-wave rectifier from flowing into the signal output part, wherein the diode, the signal output part and the gate part are connected circularly, the signal output part is arranged between the diode and the gate part, the diode and the gate part are connected to the full-wave rectifier, one side of the capacitor is connected to a location between the diode and the signal output part and an opposite side of the capacitor is connected to ground.

2. The zero-crossing detecting device according to claim 1, wherein the charger further comprises a zener diode.

3. The zero-crossing detecting device according to claim 1, wherein the signal output part comprises at least one photocoupler.

4. The zero-crossing detecting device according to claim 1, wherein the diode is a first diode, and the gate part comprises a second diode.

5. The zero-crossing detecting device according to claim 1, wherein the diode is a first diode, and the gate part comprises a second diode and a zener diode.

6. The zero-crossing detecting device according to claim 1, further comprising a discharger that discharges the charging current input from the signal output part to a ground of the full-wave rectifier.

7. The zero-crossing detecting device according to claim 6, wherein the discharger comprises at least one resistor.

8. The zero-crossing detecting device according to claim 1, wherein the zero-crossing detecting device is installed in an image forming device.

9. The zero-crossing detecting device according to claim 1, wherein the signal output part is a sensor that senses the output of the charging current.

10. The zero-crossing detecting device according to claim 1, wherein the zero-crossing detecting signal is a pulse signal.

11. A zero-crossing detecting device that detects a zero-crossing point of AC voltage, the device comprising:

a full-wave rectifier that rectifies the AC voltage and outputs a current based on a full-wave rectified voltage;

a charger circuit to which the full-wave rectified voltage is applied, wherein the charger circuit has a diode and a capacitor, and the capacitor is charged by the current and has a saturation voltage near the zero-crossing point, and the capacitor outputs a charging current when the AC voltage is approximately zero, and wherein the diode prevents the charging current from flowing back into the full-wave rectifier;

a signal output sensor that outputs a zero-crossing detecting signal, wherein the signal output sensor outputs the zero-crossing detecting signal only when the charging current flows to the signal output sensor; and a gate part, which that prevents the current output from the full-wave rectifier from flowing into the signal output parts sensor, wherein the diode, the signal output part sensor and the gate part are connected circularly, the signal output part sensor is arranged between the diode and the gate part, the diode and the gate part are connected to the full-wave rectifier, one side of the capacitor is connected to a location between the diode and the signal output part sensor and an opposite side of the capacitor is connected to ground.

12. The zero-crossing detecting device of claim 11, wherein the charger circuit is charged at a predetermined charging voltage by the full wave rectified voltage, and the charger circuit outputs the charging current when the full-wave rectified voltage falls below the charging voltage.

13. A method of detecting a zero-crossing point of AC voltage comprising:

providing a capacitor, a diode, a signal output device and a gate part, wherein the signal output device, the diode, and the gate part are connected circularly, the signal output device is arranged between the diode and the gate part, the diode and the gate part are connected to a full-wave rectifier, one side of the capacitor is connected to a location between the diode and the signal output device, an opposite side of the capacitor is connected to ground;

rectifying the AC voltage and outputting a current based on a full-wave rectified voltage from the full-wave rectifier;

applying the full-wave rectified voltage to a charger circuit, which includes the diode and the capacitor;

charging the capacitor with the current, wherein a saturation voltage of the capacitor is near the zero crossing point;

outputting a charging current from the capacitor when the full-wave rectified voltage falls below the saturation voltage;

preventing the charging current from flowing back into the full-wave rectifier;

outputting a zero-crossing detecting signal when the charging current flows to the signal output device to indicate times when the AC voltage is approximately zero; and preventing the current output from the full-wave rectifier from flowing into the signal output device with the gate part.

14. The method of detecting a zero-crossing point of AC voltage according to claim 13, wherein the method comprises outputting a pulse signal as the zero-crossing detecting signal.

* * * * *